(12) United States Patent
Gudmondson et al.

(10) Patent No.: US 7,324,162 B2
(45) Date of Patent: Jan. 29, 2008

(54) METHOD AND APPARATUS TO IMPROVE ADC DYNAMIC RANGE IN A VIDEO DECODER

(75) Inventors: Daniel Gudmondson, Austin, TX (US); Shyam Somayajula, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 523 days.

(21) Appl. No.: 10/964,550

(22) Filed: Oct. 13, 2004

(65) Prior Publication Data
US 2006/0077303 A1 Apr. 13, 2006

(51) Int. Cl.
*H03M 1/12* (2006.01)

(52) U.S. Cl. .............. 348/572; 348/677; 348/678; 348/691

(58) Field of Classification Search ........ 348/572, 348/528, 673, 677–678, 682, 689, 691, 707; *H03M 1/12*
See application file for complete search history.

(56) References Cited

U.S. PATENT DOCUMENTS

| | | | | |
|---|---|---|---|---|
| 4,628,362 A | * | 12/1986 | Waehner | 348/572 |
| 4,680,633 A | * | 7/1987 | Gerdes et al. | 348/526 |
| 5,379,075 A | * | 1/1995 | Nagasawa et al. | 348/678 |
| 6,219,107 B1 | * | 4/2001 | Renner et al. | 348/678 |
| 6,580,465 B1 | * | 6/2003 | Sato | 348/689 |
| 7,050,116 B2 | * | 5/2006 | Van Zanten et al. | 348/707 |
| 2006/0044474 A1 | * | 3/2006 | Stutz | 348/691 |

* cited by examiner

*Primary Examiner*—Trang U. Tran
(74) *Attorney, Agent, or Firm*—Wong, Cabello, Lutsch, Rutherford & Brucculeri, LLP

(57) ABSTRACT

A video decoder in which 1) resolution quality can be improved for a given bit count analog-to-digital converter, 2) a lower bit count analog-to-digital converter can be used with substantially similar quality or 3) a combination of improved resolution quality with a lower bit count analog-to-digital converter can be done. In the preferred embodiment, a DC bias is added to the video signal after the sync portion of the composite signal has been received and prior to the active video being received. This bias is then removed after the end of the active video period. By applying this bias, the DC voltage level of the video signals is actually reduced, so that the full scale value of the analog-to-digital conversion process can also be reduced. Thus, compared to using an unbiased signal, increased A/D converter resolution is obtained. In an alternative embodiment, the sync portion can be biased upwardly during the front porch and then be returned during the back porch.

14 Claims, 6 Drawing Sheets

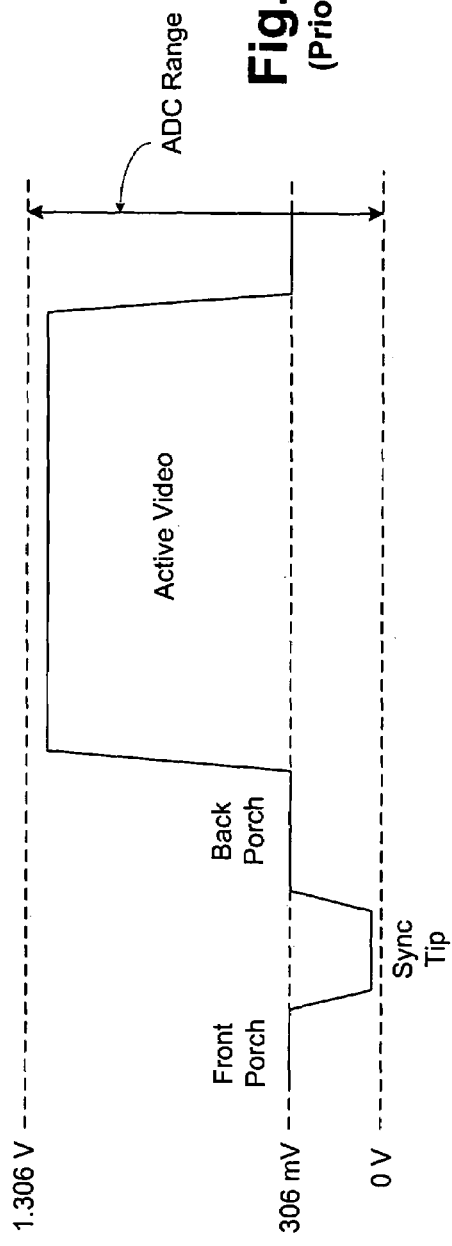
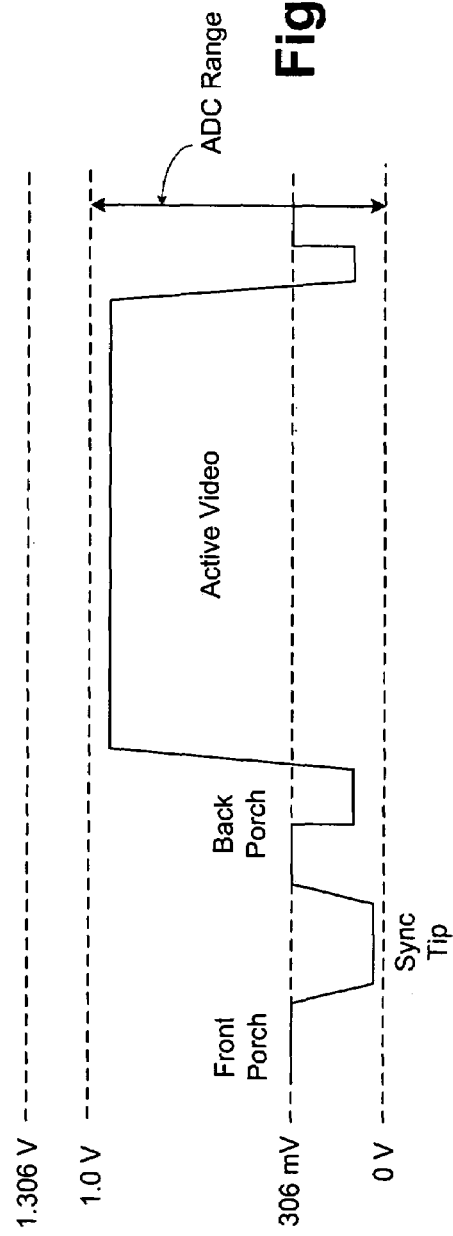

METHOD AND APPARATUS TO IMPROVE ADC DYNAMIC RANGE IN A VIDEO DECODER

BACKGROUND OF THE INVENTION

1. Field of the Inventions

The inventions generally relates to video decoders, and more specifically to input video signal shaping, and even more specifically to providing constant video signal levels and improving analog-to-digital conversion accuracy.

2. Description of Related Art

There is a large surge in the use of digital video devices today. Examples include: digital televisions, LCD TVs and monitors, DVD recorders, personal video recorders, PC video cards, video capture and streaming applications, and video conferencing. In many cases, these units need to receive an analog video signal, which may be one of the composite signals, such as NTSC, PAL or SECAM; s-video; component video or RGB. It is then desirable to produce the proper digital output, such as eight or ten bit ITU-R BT 656. It is preferred that all the video decoding be done in a single chip for all of these formats. The decoder not only has to handle composite signals, which means it must be able to determine the chroma and luma values, but it also must handle vertical blanking interval (VBI) data and handle VCR signals, which may be unstable signals.

Although a number of such systems have been developed, it is always desirable to improve the output and capabilities of the particular video decoder. For example, one common problem is resolution of any analog-to-digital converters which are utilized. For manufacturing cost reasons, it is preferable that as few digital bits as possible be used, but at the same time more digital bits are desirable to improve output quality. Therefore, it is desirable to allow both fewer bits to be used in the conversion and still improve quality.

SUMMARY OF THE INVENTION

In a video decoder according to the present invention, 1) resolution quality can be improved for a given bit count analog-to-digital converter, 2) a lower bit count analog-to-digital converter can be used with substantially similar quality or 3) a combination of improved resolution quality with a lower bit count analog-to-digital converter can be done. In the preferred embodiment a DC bias is added to the video signal after the sync portion of the composite signal has been received and prior to the active video being received. This bias is then removed after the end of the active video period. By applying this bias, the DC voltage level of the video signals is actually reduced, so that the full scale value of the analog-to-digital conversion process can also be reduced. Thus, compared to using an unbiased signal, increased A/D converter resolution is obtained.

In an alternative embodiment, the sync portion can be biased upwardly during the front porch and then be returned during the back porch. Again the video portion of the signal receives nearly the full amplitude of the reference voltage of the analog-to-digital converter for maximum resolution of the video signals.

BRIEF DESCRIPTION OF THE FIGURES

FIG. 4A is a diagram of a composite video signal illustrating voltage levels.

FIG. 4B is a diagram of a composite video signal having portions shifted according to the present invention.

DETAILED DESCRIPTION OF THE PREFERRED EMBODIMENT

Figure 1:
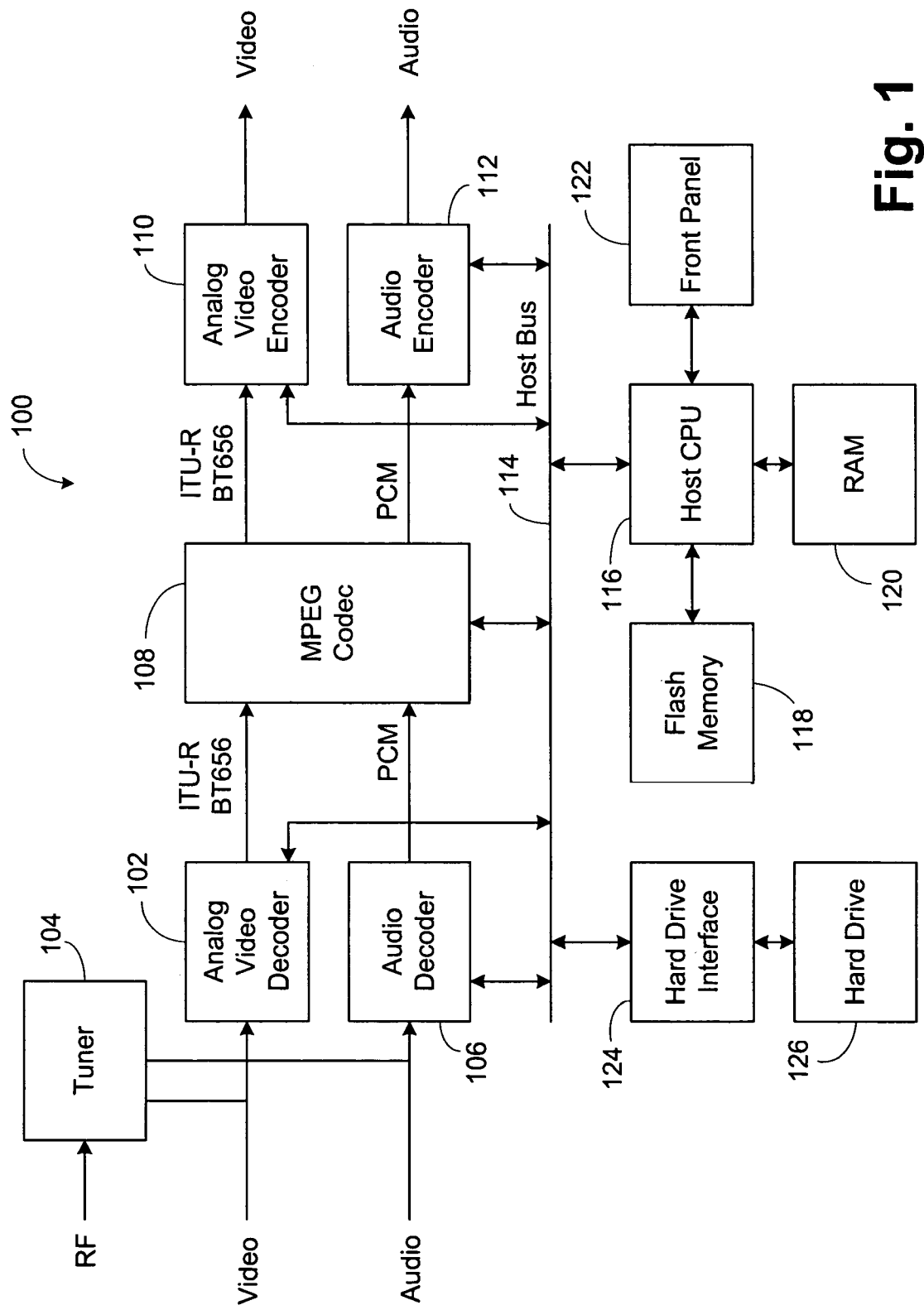
FIG. 1 displays a block diagram of an exemplary personal video recorder using an analog video decoder according to the present invention.

Referring now to FIG. 1, an exemplary personal video recorder (PVR) 100 is shown. This is an exemplary use of analog video decoder 102, and it is understood that the analog video decoder can be used in multiple applications including digital televisions, LCD (Liquid Crystal Display) TVs, DVD (Digital Versatile Disc) recorders, video capture situations, and the like. A radio frequency or broadcast signal is provided to a tuner 104. The tuner 104 provides both video and audio outputs. The video output from the tuner 104 or a video signal from an external connection is provided to analog video decoder 102. The audio signal from the tuner 104 or an external audio signal is provided to an audio decoder 106. The output in the analog video decoder 102 is preferably an ITU-R (International Telecommunication Union—Radio—Communication) BT (Broadcasting Service—television) 656 format digital signal, which is either an eight or ten bit signal. This output of analog video decoder 102 is provided to an MPEG (Moving Pictures Expert Group) codec 108 to perform video compression in the digital domain. Similarly, the audio decoder provides a PCM (Pulse Code Modulation) signal to the MPEG codec 108 to allow it to perform compression of the audio signal. The MPEG codec 108 in output mode provides an ITU-R BT 656 digital stream to an analog video encoder 110, which in turns produces an analog video signal output. Similarly, the MPEG codec 108 provides a PCM digital signal stream to an audio encoder 112, which provides an analog audio signal output.

The MPEG codec 108 is connected to a host bus 114 of a host CPU (Central Processing Unit) 116. The host CPU 116 performs processing operations and controls the various devices located in the PVR 100. The host CPU 116 is connected to flash memory 118 to hold its program and RAM (Random Access Memory) 120 for data storage. The host CPU 116 also interfaces with a front panel 122. As this is a video recorder, a hard drive interface 124 is also connected to the host bus 114, with a hard drive 126 connected to the hard drive interface. The various decoders 102 and 106 and encoders 110 and 112 are also connected to the host bus 114 to allow control and setup by the host CPU 116.

In operation, video and audio are provided to the analog video decoder 102 and the audio decoder 106, which then provide their digital streams to the MPEG codec 108. The host CPU 116 programs the MPEG codec 108 to transfer data to the hard drive interface, and thus to the hard drive 126, for storage. The host CPU 116 could at a later time direct data to be transferred from the hard drive 126 to the MPEG codec 108 for playback.

Thus it can be seen that an analog video decoder 102 is an important part of such analog-to-digital video devices.

Figure 2:
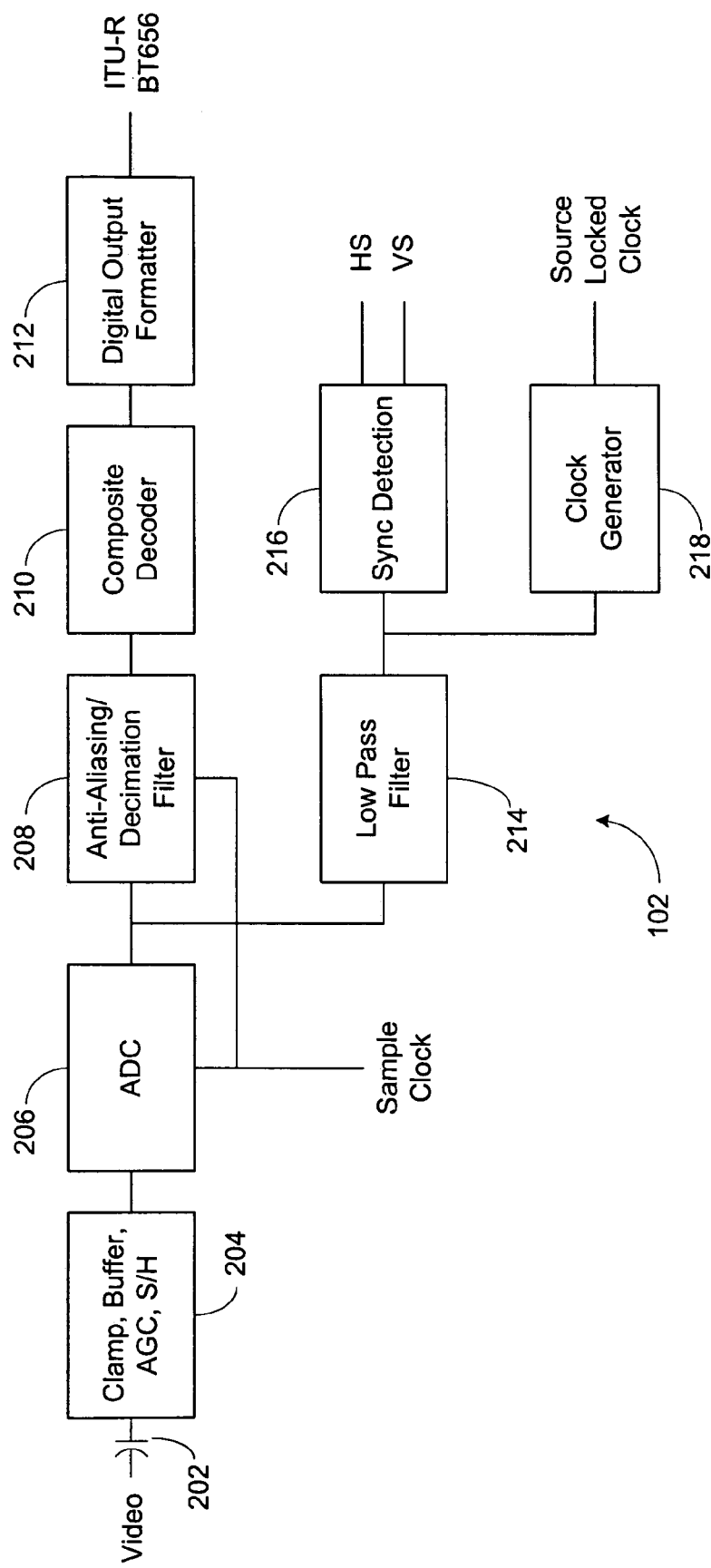
FIG. 2 is a block diagram of an analog video decoder according to the present invention.

A block diagram of an exemplary analog video decoder is shown in FIG. 2. The video signal is provided to an external capacitor 202 and is then provided to a clamp, buffer, automatic gain control (AGC) and sample and hold (S/H) block 204. This block 204 provides clamping of the video signal to ensure it does not exceed limits, impedance buffering and line driving, and automatic gain control and sample and hold. The output of block 204 is then utilized by an analog-to-digital converter (ADC) 206 which does the actual analog-to-digital conversion of the video rate signals. The ADC 206 is preferably operated on a sample clock, which is a free running sample clock and is not locked to the source video in the preferred embodiment. It is understood that in alternate embodiments a source locked clock signal could be used. The output of the ADC 206 is provided to an anti-aliasing/decimation filter 208 because preferably the ADC 206 oversamples the video signal for increased accuracy. The anti-aliasing portion is a low pass filter used to remove sampling alias effects. The decimation portion then reduces the effective sample rate down to the desired rate, such as 27 MHz. The output of the anti-aliasing/decimation filter 208 is provided to a composite decoder 210 in the case of a composite video signal such as NTSC, PAL or SECAM. The composite decoder 210 separates the luma and chroma signals and provides those to a digital output formatter 212, which produces a 4:2:2, eight or ten bit signal according to the ITU-R BT 656 standard.

The output of the analog-to-digital converter 206 is also provided to a low pass filter 214 which removes any of the video content, leaving the sync signals. The output of the filter 214 is then provided to a sync detector 216, having outputs that are horizontal and vertical sync signals. The low pass filter 214 output is also connected to a clock generator 218, which is effectively a PLL and produces a source locked clock used by other devices, if appropriate.

Various details of select parts will now be provided.

Figure 3:
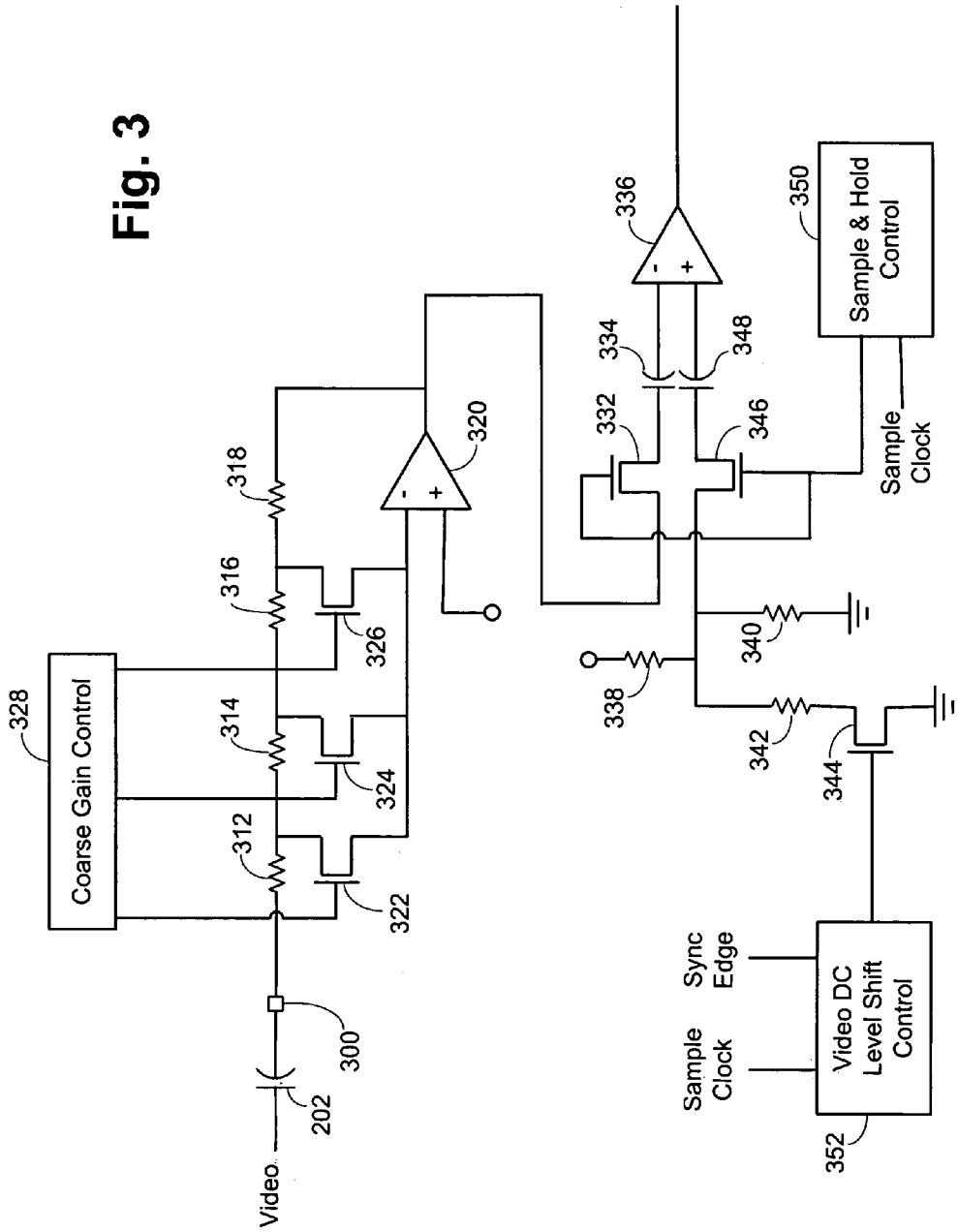
FIG. 3 is a schematic diagram of portions of the clamp, buffer, AGC and S/H block of FIG. 2 according to the present invention.

FIG. 3 provides additional details for portions of block 204. A video input pin 300 receives output of the capacitor 202.

A resistor 312 has one end connected to the input 300 and the other end connected to one end of a resistor 314. The second end of resistor 314 is connected to one end of resistor 316. The second end of resistor 316 is connected to one end of resistor 318. The second end of resistor 318 is connected to the output of an op amp 320. A switch 322 is connected between the junction of resistors 312 and 314 and the inverting input of the op amp 320. A switch 324 is connected between the junction of resistors 314 and 316 and the inverting input of the op amp 320. A switch 326 is connected between the junction of resistors 316 and 318 and the inverting input of op amp 320. The non-inverting input of the op amp 320 is connected to a desired voltage.

A coarse gain control block 328 is connected to and controls the switches 322, 324, and 326. The coarse gain control block 328 controls the switches 322, 324 and 326 to vary the feedback resistance, and thus the gain, of the op amp 320. This control is necessary to provide a first level of automatic gain control to adjust for widely varying input signal levels.

The output of the op amp 320 is connected to one side of a switch 332. The second side of the switch 332 is connected to a capacitor 334. The second side of the capacitor 334 is connected to the inverting input of an op amp 336.

A pullup resistor 338 has one end connected to a positive voltage. The second end of the resistor 338A is connected to one end of a pulldown resistor 340, which has its other end connected to ground or Vss. One end of a resistor 342 is connected to the junction of the resistors 338 and 340. The second end of resistor 342 is connected to one side of a switch 344. The other side of the switch 344 is connected to ground. A switch 346 has one side connected to the junction of resistors 338 and 340 and the other side to a capacitor 348. The second side of the capacitor 348 is connected to the non-inverting input of the op amp 336. The switches 332 and 346 are connected to a sample and hold control block 350. The control block 350 receives the sample clock and operates the switches 332 and 346 to form a sample and hold circuit of the capacitors 334, 348 and op amp 336.

A video DC level shift control block 352 controls the operation of the switch 344. Activating the switch 344 places the resistor 342 in parallel with the resistor 340. This configuration has the effect of providing a shift or bias voltage to the op amp 336. Use of this shift is described below. The control block 352 receives the sync edge signal and the sample clock to properly time the operation of the switch 344.

Figure 3A:
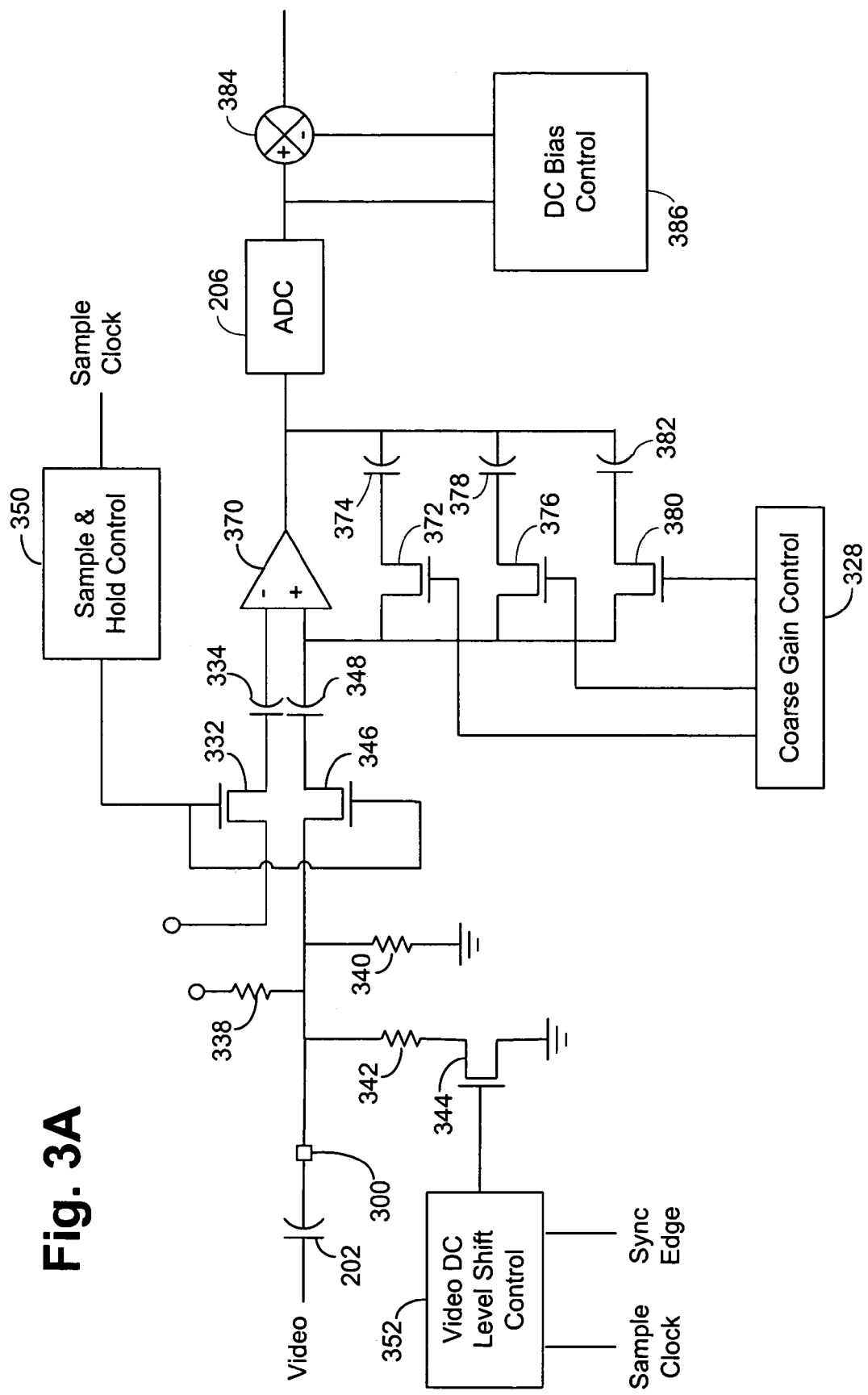
FIG. 3A is a schematic diagram of an alternative embodiment of FIG. 3.

FIG. 3A illustrates an embodiment in which the gain and sample and hold functions have been combined into a single op amp and switched capacitor feedback is used for gain control as opposed to switched resister feedback.

In this embodiment, the switch 332 receives a bias voltage while the switch 346 is connected to the input pin 300 so that the resistors 338, 340 and 342 operate directly on the input signal. Further, the capacitors 334 and 348 are connected to the inputs of an op amp 370, which has an output that is connected to the ADC 206.

To perform gain control, a set of three series switches and capacitors, respectively 372 and 374, 376 and 378, and 380 and 382, are connected between the non-inverting input of op amp 370 and the output of op amp 370. The coarse gain control circuit 328 controls the switches 372, 376 and 380 to provide the desired gain.

FIG. 3A also shows a DC bias restoration circuit. The output of the ADC 206 is provided to a summing junction 384 and to DC bias control circuitry 386. The DC bias control circuitry 386 analyzes the output of the ADC 206 and determines if any residual DC bias is present in the output. If so, the DC bias control circuitry 386 provides a signal representing the residual DC bias to a subtracting input of the summing junction 384. The corrected output from the summing junction 384 is provided to the anti-aliasing/decimation filter 208 and the low pass filter 214.

FIG. 4A illustrates the waveform and voltage levels of a composite video signal. The sync tip is preferably set at a voltage level of approximately 20 mV. The blanking portions of the front and back porches, the portions of the signal prior to and following the sync portion, are preferably at approximately 306 mV, based on the sync tip level and the operation of the AGC circuitry. These settings result in a peak voltage of 1.020 V for the active video portion of the signal. To provide some headroom, a full scale voltage of the 1.306 V is used.

In prior art operation, this 1.306 V was set as the full range reference voltage for the ADC 206. However, observing the waveform, it is apparent that only approximately 1.0 V of the entire 1.306 V range is actually used for active video information. Thus approximately 30% of the ADC 206 resolution is unused. This results in either lower video quality or the use of a higher bit ADC.

In a system according to the present invention, the switch 344 is activated during the blanking period of the back porch as shown in FIG. 4B, preferably after the color burst. This activation results in a downward DC shift of the video signal. Thus, the blanking signal level changes to approximately 100 mV. Given that the active video portion can swing to 714 mV greater than this level, the maximum signal level is only 814 mV. By setting the reference voltage level of the ADC 206 to a lower voltage such as 1.0 V, a larger amount of the scale of the ADC is used. The lower 30% of the range is now used during the active video portion. Therefore, either 1) higher quality digitization can occur for the same number of ADC bits, 2) fewer bits can be used for the same quality or 3) a combination of 1) and 2) can be done.

After the active video portion ends and the front porch is occurring, the switch 344 is opened so that the shift is removed. This switching results in the sync tip portion being at the desired level, simplifying sync capture and other timing related operations.

Figure 4C:
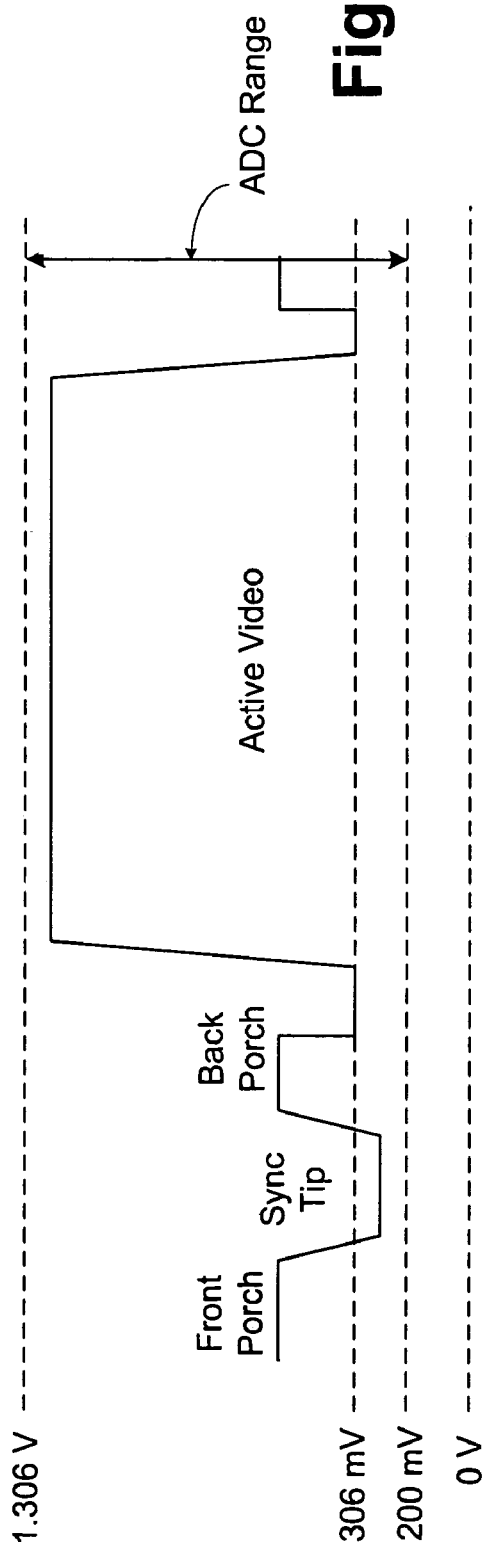
FIG. 4C is a diagram of an alternate embodiment of a composite video signal having portions shifted according to the present invention.

While shifting of the active video signal downwards is the preferred embodiment, it is also possible to shift the sync tip portions upwardly and allow the active video portions to be unshifted as shown in FIG. 4C. In this embodiment, a DC offset value is provided to the ADC 206 to shift the range upward. While this approach also reduces the overall voltage swing, it complicates sync detection and so is not preferred.

While illustrative embodiments of the invention have been illustrated and described, it will be appreciated that various changes can be made therein without departing from the spirit and scope of the invention.

The invention claimed is:

1. A system to improve dynamic range of an analog to digital conversion of a composite video signal, the system comprising:
   a video signal input for receiving an analog composite video signal;
   a gain control amplifier coupled to said video signal input and having a gain control amplifier output;
   a sample and hold circuit having a sample and hold circuit input coupled to said gain control amplifier output and having a sample and hold circuit output;
   a DC level shift circuit connected to said sample and hold circuit input to DC shift a portion of said gain control amplifier output to reduce the full maximum voltage swing of said sample and hold circuit output to a reduced maximum voltage swing; and
   an analog to digital converter having an input coupled to said sample and hold circuit output, having a reference voltage related to the reduced maximum voltage swing rather than the full maximum voltage swing and having an analog to digital converter output,
   wherein said DC level shift circuit shifts a portion of the back porch, the active video and a portion of the front porch of the video signal to a reduced voltage level, and
   wherein said DC level shift circuit includes:
      a resistor divider formed by a pullup and a pulldown resistor, the junction of the resistor divided being connected to said sample and hold circuit input;
      a series combination of a resistor and a switch in parallel with said pulldown resistor; and
      a DC level shift control circuit coupled to said switch and for receiving timing and clocking signals to properly activate said switch.

2. The system of claim 1, wherein said DC level shift circuit shifts a portion of the front porch, the sync and a portion of the back porch to an increased voltage level.

3. An analog video decoder comprising:
   a system to improve dynamic range of an analog to digital conversion of a composite video signal, the system including:
      a video signal input for receiving an analog composite video signal;
      a gain control amplifier coupled to said video signal input and having a gain control amplifier output;
      a sample and hold circuit having a sample and hold circuit input coupled to said gain control amplifier output and having a sample and hold circuit output;
      a DC level shift circuit connected to said sample and hold circuit input to DC shift a portion of said gain control amplifier output to reduce the full maximum voltage swing of said sample and hold circuit output to a reduced maximum voltage swing; and
      an analog to digital converter having an analog-to-digital converter input coupled to said sample and hold circuit output, having a reference voltage related to the reduced maximum voltage swing rather than the full maximum voltage swing; and having an analog-to-digital converter output;
   a filter having a filter input coupled to said analog to digital converter output and providing a filter output;
   a composite decoder having a composite decoder input coupled to said filter output and providing a composite decoder output;
   a digital formatter having a digital formatter input coupled to said composite decoder output and providing a digital video signal output;
   a low pass filter having a low pass filter input coupled to said analog to digital converter output and providing a low pass filter output;
   a sync detector circuit having a sync detector circuit input coupled to said low pass filter output and providing horizontal and vertical sync outputs; and
   a clock generator having a clock generator input coupled to said low pass filter output and providing a source locked clock output.

4. The decoder of claim 3, wherein said DC level shift circuit shifts a portion of the back porch, the active video and a portion of the front porch of the video signal to a reduced voltage level.

5. The decoder of claim 4, wherein said DC level shift circuit includes:
   a resistor divider formed by a pullup and a pulldown resistor, the junction of the resistor divided being connected to said sample and hold circuit input:
   a series combination of a resistor and a switch in parallel with said pulldown resistor; and
   a DC level shift control circuit coupled to said switch and for receiving timing and clocking signals to properly activate said switch.

6. The decoder of claim 3, wherein said DC level shift circuit shifts a portion of the front porch, the sync and a portion of the back porch to an increased voltage level.

7. A system to improve dynamic range of an analog to digital conversion of a composite video signal, the system comprising:
   a video signal input for receiving an analog composite video signal;
   a sample and hold circuit coupled to said video signal input and having a sample and hold circuit output;
   a DC level shift circuit connected to said sample and hold circuit input to DC shift a portion of said sample and hold circuit input to reduce the full maximum voltage swing of said sample and hold circuit output to a reduced maximum voltage swing; and an analog to digital converter having a analog-to-digital converter input coupled to said sample and hold circuit output, having a reference voltage related to the reduced maximum voltage swing rather than the full maximum voltage swing and having an analog-to-digital circuit output wherein said DC level shift circuit shifts a portion of the back porch, the active video and a portion of the front porch of the video signal to a reduced voltage level, and wherein said DC level shift circuit includes:

a resistor divider formed by a pullup and a pulldown resistor, the junction of the resistor divided being connected to said sample and hold circuit input;

a series combination of a resistor and a switch in parallel with said pulldown resistor; and a DC level shift control circuit coupled to said switch and for receiving timing and clocking signals to properly activate said switch.

8. The system of claim 7, wherein said DC level shift circuit shifts a portion of the front porch, the sync and a portion of the back porch to an increased voltage level.

9. The system of claim 7, wherein said sample and hold circuit includes:

an op amp having inverting and non-inverting inputs and an output; and selectable feedback from the output of said op amp to one input of said op amp to provide for gain control.

10. An analog video decoder comprising:

a system to improve dynamic range of an analog to digital conversion of a composite video signal, the system including:

a video signal input for receiving an analog composite video signal;

a sample and hold circuit coupled to said video signal input and having a sample and hold circuit output;

a DC level shift circuit connected to said sample and hold circuit input to DC shift a portion of said sample and hold circuit input to reduce the full maximum voltage swing of said sample and hold circuit output to a reduced maximum voltage swing; and an analog to digital converter having an analog to digital converter input coupled to said sample and hold circuit output, having a reference voltage related to the reduced maximum voltage swing rather than the full maximum voltage swing and having an analog to digital converter output;

a filter having a filter input coupled to said analog to digital converter output and providing a filter output;

a composite decoder having a composite decoder input coupled to said filter output and providing a composite decoder output;

a digital formatter having a digital formatter input coupled to said composite decoder output and providing a digital video signal output;

a low pass filter having a low pass filter input coupled to said analog to digital converter output and providing a low pass filter output;

a sync detector circuit having a sync detector circuit input coupled to said low pass filter output and providing horizontal and vertical sync outputs; and a clock generator having a clock generator input coupled to said low pass filter output and providing a source locked clock output.

11. The decoder of claim 10, wherein said DC level shift circuit shifts a portion of the back porch, the active video and a portion of the front porch of the video signal to a reduced voltage level.

12. The decoder of claim 11, wherein said DC level shift circuit includes:

a resistor divider formed by a pullup and a pulldown resistor, the junction of the resistor divided being connected to said sample and hold circuit input;

a series combination of a resistor and a switch in parallel with said pulldown resistor; and a DC level shift control circuit coupled to said switch and for receiving timing and clocking signals to properly activate said switch.

13. The decoder of claim 10, wherein said DC level shift circuit shifts a portion of the front porch, the sync and a portion of the back porch to an increased voltage level.

14. The decoder of claim 10, wherein said sample and hold circuit includes:

an op amp having inverting and non-inverting op amp inputs and an op amp output; and selectable feedback from the output of said op amp to one input of said op amp to provide for gain control.

* * * * *